United States Patent [19]
Howells et al.

[11] Patent Number: 5,455,850
[45] Date of Patent: Oct. 3, 1995

[54] X-RAY LITHOGRAPHY USING HOLOGRAPHIC IMAGES

[75] Inventors: Malcolm R. Howells, Berkeley, Calif.; Chris Jacobsen, Sound Beach, N.Y.

[73] Assignee: The Regents of the Univerity of Calif., Oakland, Calif.

[21] Appl. No.: 786,265

[22] Filed: Nov. 1, 1991

[51] Int. Cl.$^6$ .................................................. G21K 5/00
[52] U.S. Cl. ............................. 378/34; 378/35; 378/36
[58] Field of Search ............................ 328/34, 35, 36; 250/492.1, 492.2; 359/1, 12, 15, 32

[56] References Cited

U.S. PATENT DOCUMENTS

| | | | |
|---|---|---|---|
| 3,917,380 | 11/1975 | Kato et al. | 359/35 |
| 4,013,338 | 3/1977 | Sato | 359/35 |
| 4,360,586 | 11/1982 | Flanders et al. | 378/35 |
| 4,444,456 | 4/1984 | Jain et al. | 359/35 |
| 4,846,552 | 7/1984 | Veldkemp et al. | 359/572 |
| 4,947,413 | 8/1990 | Jewell et al. | 378/34 |

*Primary Examiner*—David P. Porta
*Attorney, Agent, or Firm*—Paul R. Martin; Kathleen S. Moss; Pepi Ross

[57] ABSTRACT

A non-contact X-ray projection lithography method for producing a desired X-ray image on a selected surface of an X-ray-sensitive material, such as photoresist material on a wafer, the desired X-ray image having image minimum linewidths as small as 0.063 μm, or even smaller. A hologram and its position are determined that will produce the desired image on the selected surface when the hologram is irradiated with X-rays from a suitably monochromatic X-ray source of a selected wavelength $\lambda$. On-axis X-ray transmission through, or off-axis X-ray reflection from, a hologram may be used here, with very different requirements for monochromaticity, flux and brightness of the X-ray source. For reasonable penetration of photoresist materials by X-rays produced by the X-ray source, the wavelength X, is preferably chosen to be no more than 13.5 nm in one embodiment and more preferably is chosen in the range 1–5 nm in the other embodiment. A lower limit on linewidth is set by the linewidth of available microstructure writing devices, such as an electron beam.

27 Claims, 8 Drawing Sheets

FIG. 11 ns/prefix 5,455,850

X-RAY LITHOGRAPHY USING HOLOGRAPHIC IMAGES

FIELD OF THE INVENTION

This invention relates to X-ray lithography for feature sizes below 0.25 µm. This invention was made, in part, with Government support under Contract DE-AC03-76SF00098 between the U.S. Department of Energy and the University of California for the operation of the Lawrence Berkeley Laboratory and in part with support from the State University of New York. The United States Government and the Research Foundation of the State University of New York have certain rights in this invention.

BACKGROUND OF THE INVENTION

As feature sizes on integrated circuits approach the minimum size possible with visible or ultraviolet wavelengths optics, other technologies are considered for circuit manufacturing techniques. X-ray proximity lithography is one alternative technique which has been developed, and while its use in circuit production with minimum linewidth 250 nanometers (nm) seems likely, blurring through diffraction at practical mask-to-wafer separation distances complicates extension of the technique to significantly finer line widths. Recently, X-ray projection lithography has begun to be considered. J. E. Bjorkholm et al, in Jour. Vac. Sci. Technol., vol. B8 (1990) pp. 1509–1513, have demonstrated the printing of 50 nm line width features using a 20:1 reduction system based on near-normal incidence optics, coated with multilayers for good reflectivity at $\lambda=14$ nm wavelength. Along with other developments, this has led to considerable activity aimed at the development of X-ray projection lithography systems capable of printing features of size 100 nm or finer over a large field with high throughput for use in circuit production.

Most of the optical systems discussed in the literature for use in X-ray projection lithography have been based on the use of multilayer-coated, near-normal incidence optics. At present, multilayer-coated optics are able to deliver good normal incidence reflectivity only at relatively long wavelengths ($\lambda>10$ nm), where X-ray penetration in photoresist materials is low and the contrast of likely contaminants is high compared to the $\lambda\approx 1$ nm wavelengths used for X-ray proximity lithography. Further, while 1:1 systems using only flat and spherical optics have been proposed which would have curved image fields, T. E. Jewell et al, in Jour. Vac. Sci Technol., vol. B8 (1990) pp. 1519–1523, have found that at least 4-aspherical optics are required for a 20:1 reduction system with the required field and resolution. The figure tolerances of such optics are in the 0.5–1 nm range over a diameter of many cm, which is well beyond current fabrication limits, even for spherical optics, as noted in W. Silfvast, ed., Workshop on High Precision Soft X-ray Optics, Rockville, Md., October 1989. These and other considerations indicate that the challenges involved in the development of X-ray projection lithography by optical reduction are daunting, or even insurmountable, even considering the commercial payoff expected of such systems.

Holographic optics were first proposed over twenty years ago for visible light lithography, by K. A. Stetson, Appl. Phys., Lett., vol. 12 (1967) pp. 362–364, by E. B. Champayne et al, Appl. Optics, vol. 8 (1969) pp. 1879–1885, and by M. J. Beesley et al, Electronics Lett., vol. 4 (1970) pp. 49–50. These methods did not become popular, because better and easier alternatives were developed based on the use of lenses for optical reduction. However, once one considers soft X-ray projection lithography, for which refracting lenses cannot be used, the technology for reduction imaging outlined above involves the enormous technological challenges referred to above, and it becomes worthwhile to consider again the potential contribution of holographic techniques.

What is needed is a technique for optical lithography that: (1) allows definition of integrated circuit feature sizes of the order of 0.25 µm and below; (2) is simple, preferably requiring only one or two optical components; (3) is relatively free of optical aberrations; (4) is relatively easy to fabricate; (5) allows reasonably uniform illumination of the desired image area; and (6) provides some means of dealing with high incoming power loads.

SUMMARY OF THE INVENTION

These needs are met by the invention, which provides a method that projects a holographic image of the desired circuit pattern onto the wafer or other image-receiving substrate to allow recording of the desired image in photoresist material, for use in subsequent microfabrication steps. In a first embodiment, the method uses on-axis transmission and requires the following steps: (1) providing a high flux X-ray source, whose X-ray monochromaticity and coherence requirements are modest and would, for example, be satisfied by a standard X-ray tube; (2) providing a layer of light-sensitive photoresist material on the wafer with a selected surface to receive the image(s); (3) determining a hologram having variable optical thickness and variable associated optical phase angle and amplitude attenuation, for transmission of X-rays through the hologram, where irradiation of the hologram produces the desired X-ray image at the wafer with minimum X-ray image linewidths that can be smaller than 0.25 µm; (4) positioning the hologram at a suitable object plane; and (5) irradiating the selected surface with X-rays received by transmission through (and diffraction from) the hologram.

In a second embodiment of the invention that uses off-axis holography, the wafer receives the holographic image by grazing incidence reflection from a hologram printed on a flat metal or other highly reflecting surface or substrate, and the zero order diffraction beam passes to the side of the wafer. In this embodiment, an X-ray beam with a high degree of monochromaticity and spatial coherence is required.

The following advantages can be adduced for the use of holographic methods.

(1) The holographic real image is aberration-free in either embodiment, if the hologram is illuminated by the conjugate of the reference beam that was used to form (or compute) the hologram. This is exact within diffraction limits.

(2) One can achieve aberrationless imaging, using only a single optical component, a computer-generated hologram that replaces both the imaging optics and the mask of a conventional projection system.

(3) An on-axis hologram (first embodiment), can modulate both the phase and the amplitude of the transmitted X-ray beam, to project the desired intensity pattern on the wafer. The coherence length required is modest ($\lambda/\Delta\lambda\approx 20$–45); a coherence width of 20 µm or less is also required.

(4) The off-axis method (second embodiment) does not require that the hologram be used at normal incidence, and there are advantages to using gazing incidence X-ray beams: (a) the power load of the X-ray beam is spread over a larger area, and (b) the tolerances for surface figure and finish are relaxed compared to normal incidence.

(5) An off-axis hologram (second embodiment) is rigid and can be cooled.

(6) Only one optical component is needed for either embodiment, and this component can be flat, which is good for fabrication and for stray light reduction.

(7) The hologram in the second embodiment would be larger than the final image, but the difficulty in terms of resolution and distortion tolerances would be similar to that in mask making for proximity printing at the same feature size.

(8) No special effort is required to illuminate the hologram uniformly in the second embodiment. Slowly varying non-uniformities of illumination have an effect only on the shape of the resolution function, and this can be corrected in forming the hologram if the illumination forms are known.

(9) In both embodiments, the use of multi-layer coatings is avoided and the required hologram writing resolution is similar to that of a 1:1 proximity mask for the same pattern.

A disadvantage of the second embodiment is that a highly monochromatic, single-mode X-ray beam is needed to illuminate the off-axis hologram. The monochromaticity value $\lambda/\Delta\lambda$ needs to be of the order of the number of resolvable features within the image width, which is $\geq 5\times 10^4$ for useful images.

DESCRIPTION OF MODES OF PRACTICE OF THE INVENTION

Figure 1:
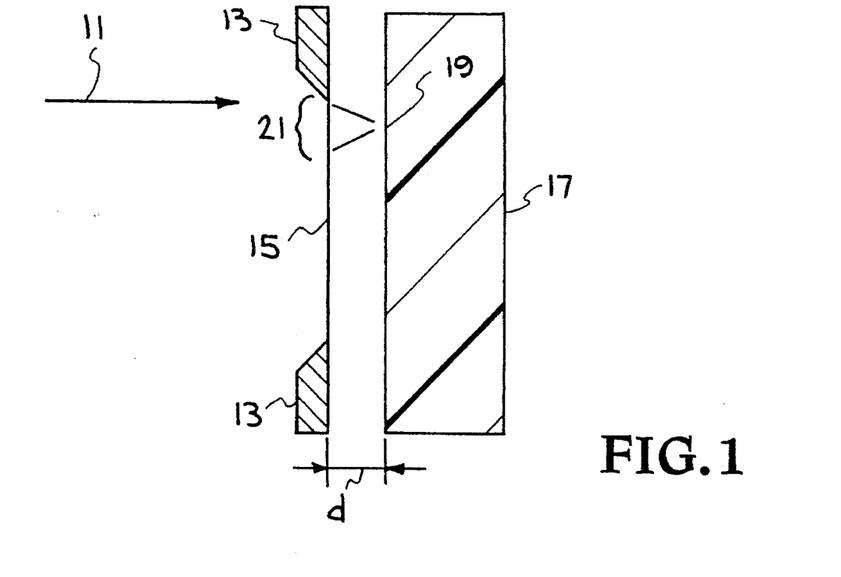
FIG. 1 is a diagram illustrating the implementation of the first embodiment of the invention, involving reconstruction of a holographic image by transmission of light through the hologram.

In an on-axis embodiment of the invention, shown in FIG. 1, a plane wave X-ray beam, including a representative X-ray 11, is incident on a hologram 15 with an associated opaque frame 13 to be used to produce the desired image or pattern on a chosen wafer or substrate 17. For a given choice of a separation distance d between the hologram 15 and a wafer or substrate 17, an image pixel at a position 19 is contributed to by a localized group of points 21 on the holographic image source 15. The size of the area defined by the group of points 21 is determined by the maximum diffraction angle and by the distance d. In practice, the distance d may be chosen in the range 20 μm ≤ d ≤ 3000 μm. The embodiment illustrated in FIG. 1 uses transmission projection of a holographic image.

The in-line holographic geometry shown in FIG. 1 is similar to the geometry for contact printing except that the hologram replaces the mask and is located at a larger distance d=20–300 μm, preferably d≈200 μm, from the wafer in this example. This on-axis embodiment is implemented by use of an algorithm for designing the hologram, where diffraction effects caused by wavefield propagation over a distance d are accounted for.

Figure 2:
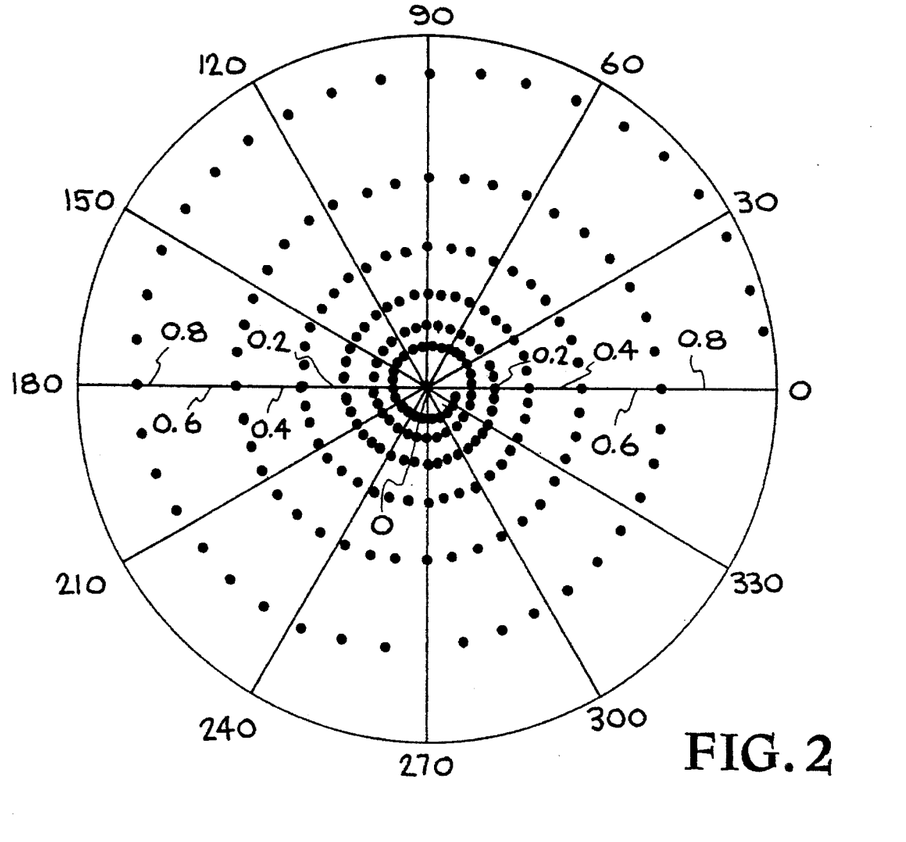
FIG. 2 illustrates the Argand diagram of wave phase angle change $\theta$ versus wave attenuation factor r for carbon for the actual complex refractive index at wavelength $\lambda=5$ nm.

We seek a hologram 15 that diffracts an incoming plane wave to form the desired image intensity at the wafer 17. This is an inverse diffraction problem, which is always involved in the design of computer-generated holograms and which has been discussed fairly extensively in the literature, for example, by J. R. Fienup, Opt. Eng., vol. 19 (1980) pp. 297–305, and by S. H. Lee, ed., Special Issue on Computer Generated Holograms, Appl. Optics, vol. 26 (1987) pp. 4350–4399. The hologram is assumed to be constructed from an optical medium whose thickness h varies with position and can be chosen by an algorithm, discussed below, and whose complex refractive index $n=1-\delta-i\beta$ at the X-ray wavelength $\lambda$ is known. A constant thickness membrane, or a support membrane that does not further modulate the transmitted wavefield, is assumed to support the hologram. If the thickness h at a certain location in the hologram is chosen to produce a desired value for the phase change ($\theta=2\pi\delta h/\lambda$), the amplitude attenuation factor r must be $r=\exp(-2\pi\beta h/\lambda)$. Therefore, the only allowed combinations of amplitude and phase of the beam are those that lie on the logarithmic spiral $r = \exp(-\theta\beta/\delta)$ in the complex plane (r versus $\theta$ in polar coordinate form). An example of such a curve, for carbon at $\lambda=5$ nm, is shown in FIG. 2. Carbon has a refractive index $n=1-\delta-i\beta$ with $\delta=0.0039$ and $\beta=0.0027$ at $\lambda=5$ nm. Other attractive choices of the hologram material include germanium (at $\lambda=1$ nm), silicon (1.24 nm), GaAs (1.1 nm), $Si_3N_4$ (3 nm), $SiO_2$ (2.5 nm), fused quartz, nickel (1.4 nm), gold (0.56 nm), silver (0.36 nm), platinum (0.44 nm) and palladium (0.38 nm).

Figure 3A:
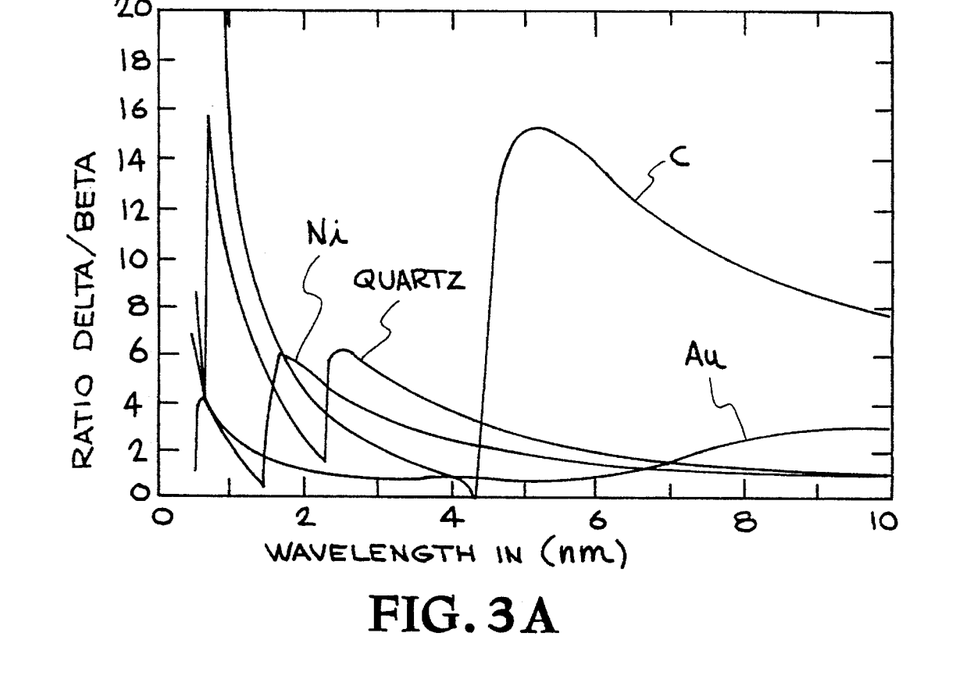
FIGS. 3A and 3B graphically illustrate the ratio $\delta/\beta$ for several materials of interest for wavelengths $\lambda=0.5$–10 nm and the thickness(es) required to produce a phase change of $\pi$.
Figure 3B:
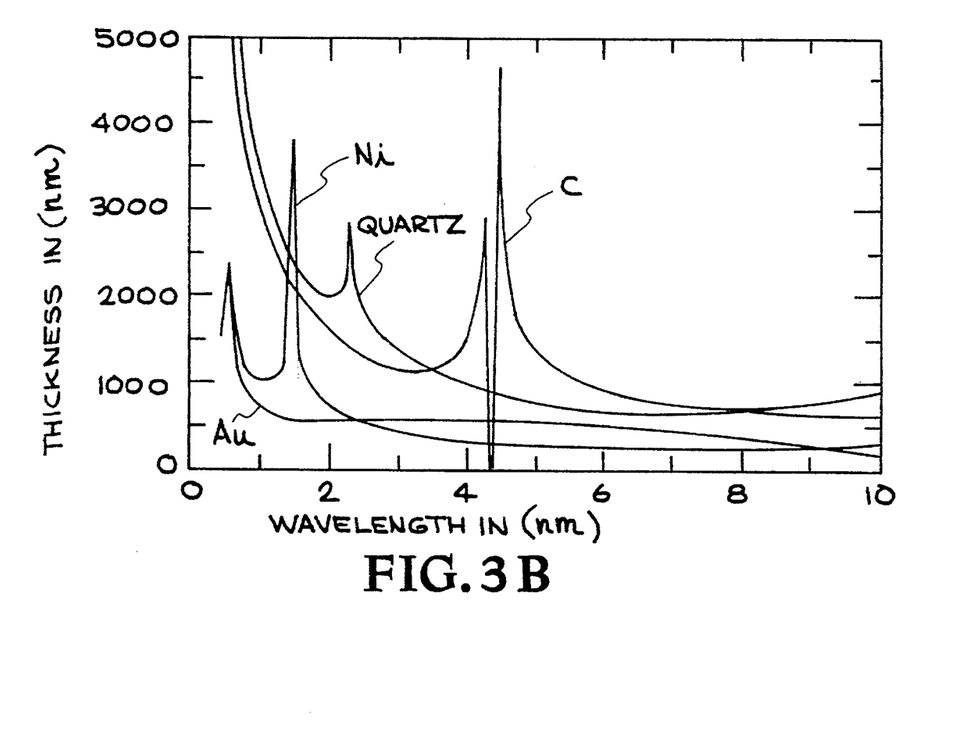

Because most of the information in diffractive imaging techniques is encoded as phase, we prefer to use materials with a large ratio $\delta/\beta$ for transmission holographic optical elements. This allows large phase changes for the thickness h to be achieved somewhat independently of changes in amplitude. If large signal attenuation by the hologram 15 in FIG. 1 is required, the signal attenuation can at least approximate this by adding a suitable integer multiple of $2\pi$ to the phase angle θ. Considerations of resist penetration, resist resolution and organic contaminant contrast suggest that optimum wavelengths for X-ray lithography are either just above the carbon K edge at λ=4.4 nm, or at λ=1–2 nm. Use of λ>10 nm X-rays in many of the published projection lithography schemes is driven by considerations of multilayer technology that are not involved here. FIGS. 3A and 3B show the ratio δ/β and the thickness required to obtain a 2π phase shift in several materials that have already been successfully used to make high resolution Fresnel zone plates (another type of holographic optical element). All these materials have favorably high ratios δ/β at λ≈1 nm wavelength, and δ/β is also high on the long wavelength sides of the absorption edges. One benefit of considering shorter wavelengths is that, for a desired transverse resolution D, the depth of field DOF≈4 $D^2/λ$ for 100 nm resolution projection lithography increases to even more favorable values. For the example calculations presented here, we shall consider the use of carbon at λ=5 nm wavelength, although the method is applicable generally, including extension to the λ≈1 nm wavelength region.

Figure 4:
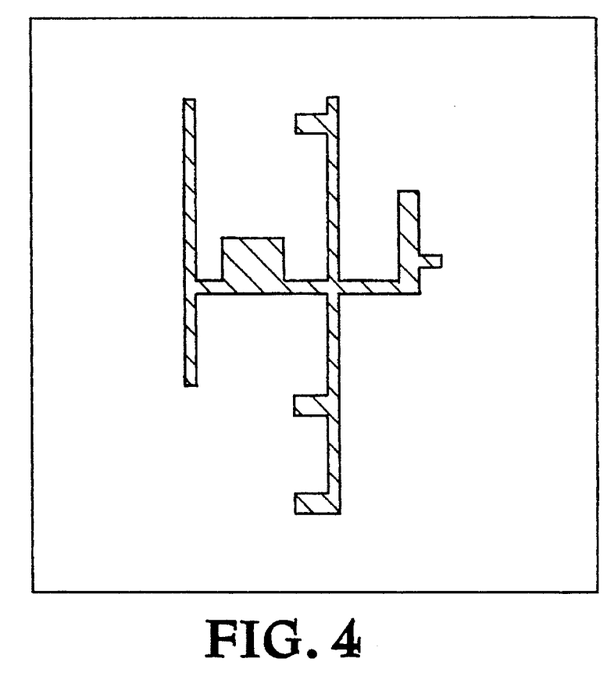
FIG. 4 illustrates an example pattern chosen to demonstrate an algorithm used to design the hologram.

The binary test-object for which specific calculations have been done, shown in FIG. 4, is represented by 256×256 0.063 $μm^2$ pixels, and has black or zero-exposure features ranging in size from 0.063 μm to 1.0 μm on a uniform white background of normalized intensity 1.0. We chose the very narrow minimum linewidth (0.063 μm) to provide a severe test of the algorithm for designing the hologram, although the application of the procedure to pattern minimum feature sizes in the 0.1–0.25 μm range is of immediate interest and is easier to implement.

We now describe one procedure that can be used to design a carbon hologram to deliver the X-ray intensity pattern in FIG. 4 to the wafer. As a first step, we backpropagate a λ=5 nm wave field whose initial phase and amplitude at the wafer plane are equal to zero and to the square root of the desired pattern intensity, respectively. This wave field arrives at the hologram plane (located d=200 μm upstream from the wafer) with definite known values of the amplitude and phase at each pixel. We wish to design the hologram so that a unit intensity plane wave transmitted through the hologram would match these values. To do this with carbon, we only have access to complex numbers lying on the spiral in FIG. 2, so we proceed (within a specified upper limit on the pattern thickness) by choosing the correct value for the phase and adding whatever multiple of 2π gets us closest to the correct amplitude. This produces the zero order approximation to the hologram. By forward propagating the wave field that would be transmitted by this hologram to the wafer plane and by taking the square of the magnitude, a zero order approximation to the desired image at the wafer is produced, which image turns out to be a surprisingly good approximation to the desired pattern. We wish to produce a more accurate print of the desired pattern intensity, but we have no interest in controlling the optical phase at the wafer plane. Therefore, for the next iteration we leave the current value of the phase at the wafer plane unchanged. For a desired intensity of 0, we set the wafer-plane magnitude to 0, calculate the average magnitude of the non-zero or "white" pixels, and choose those pixels to have a magnitude, of 1.05 times the average magnitude to drive the algorithm to improving the diffraction efficiency of the hologram while simultaneously producing a uniform "white" intensity. The numerical factor 1.05 here is an example and may be replaced by any number between 1.0 and 1.5 according to convenience. We then combine these magnitude and phase values, backpropagate to the hologram plane, approximate the complex amplitude as before, forward propagate to the wafer plane, and continue this procedure for the desired number of iterations.

Figure 5:
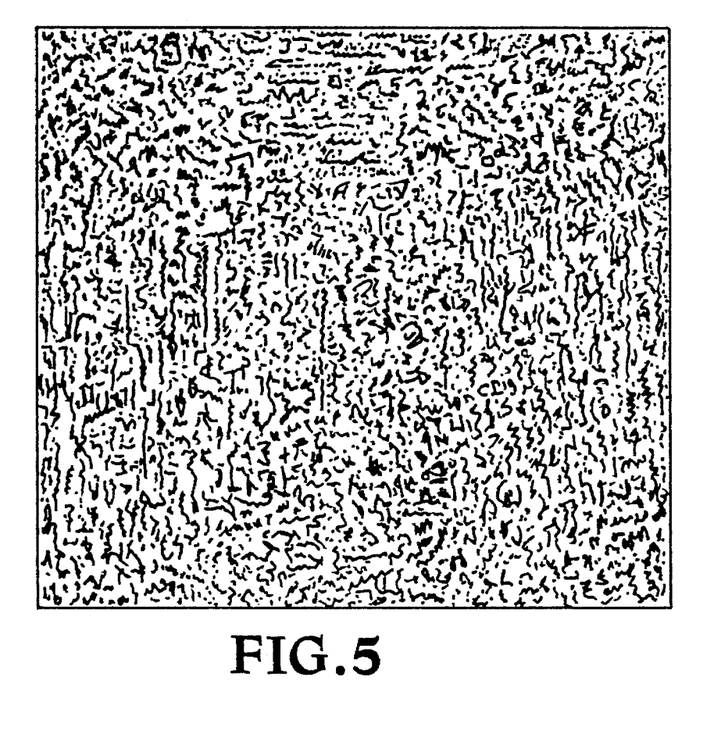
FIG. 5 illustrates the transparency of a hologram that will produce the desired image shown in FIG. 4 with high fidelity.
Figure 6:
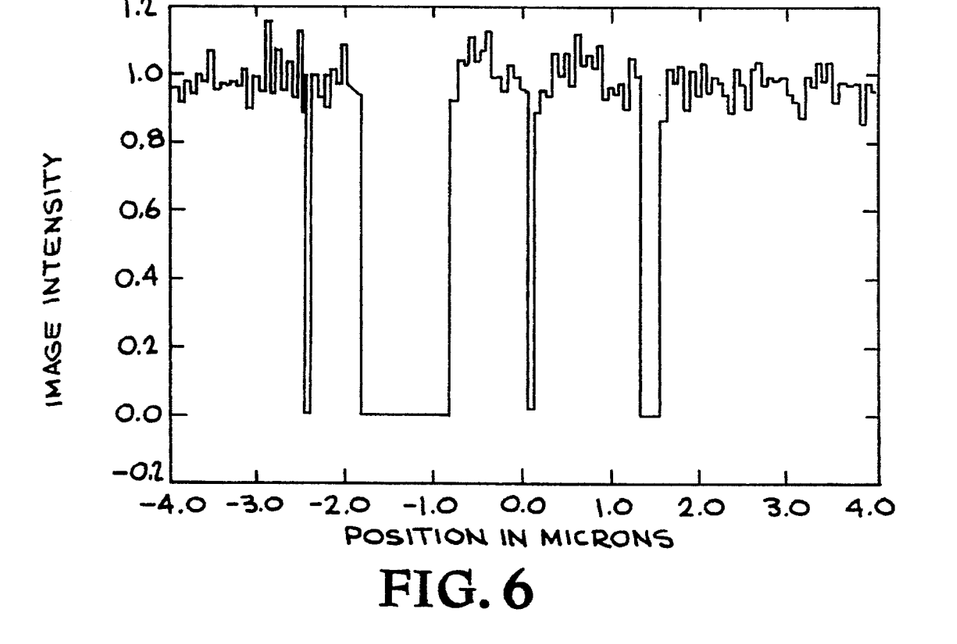
FIG. 6 graphically illustrates image intensity versus spatial position for a line scan performed along a line through the image produced by the hologram illustrated in FIG. 5.

The carbon thickness or hologram pattern calculated by 100 iterations of this procedure is shown in FIG. 5. This procedure chooses low carbon thickness for most pixels. The wafer plane intensity, produced when this hologram is illuminated by a unit plane wave, is nearly identical with the desired image shown in FIG. 4; the desired dark features remain dark, and the light features have a normalized intensity in the range 0.7–1.5, with an average value close to the target value of 1.0. The good fidelity of this image is also illustrated in FIG. 6, which shows the intensity pattern across a scan fine of the wafer-plane image. Ideally, the image relative intensity at each point should be either 1.0 or 0. However, the values illustrated here are easily within the accuracy needed for microlithographic processing. Note that the resolution of the image is essentially the same as that of the hologram. This is true in general for in-line holograms, of which the zone plate is another example. Thus, the manufacturing tolerances and field size required in making the hologram would be essentially the same as for producing a proximity mask for the same test pattern. This result is an important advantage of the present approach, and should be compared to the formidable 0.5–1 nm surface manufacturing tolerances required for the optical reduction projection lithography systems described above.

Figure 7:
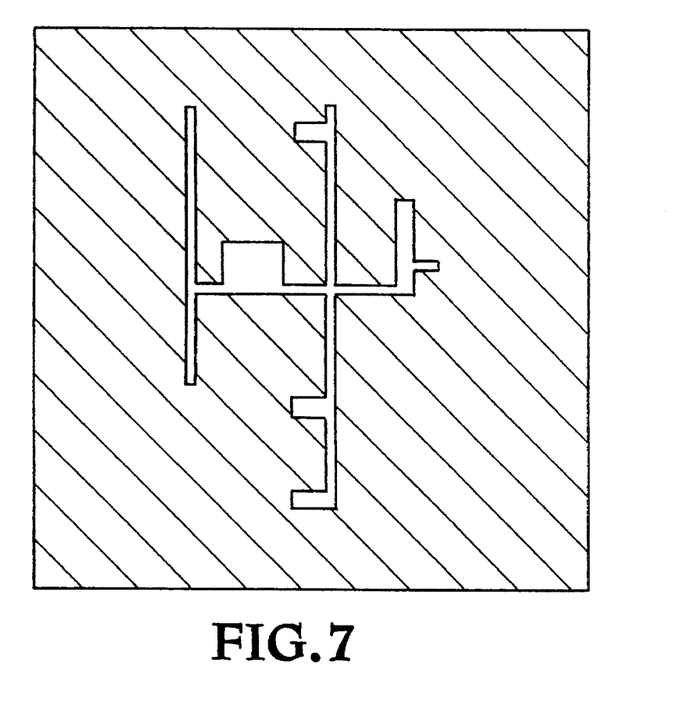
FIG. 7 illustrates a second example or pattern, which is the complement of the pattern shown in FIG. 4, used to demonstrate the algorithm.

The calculations presented thus far relate to a mostly-white type of test object. We have also tested the applicability of the method to mostly-black objects by utilizing the complement of the object in FIG. 4 as the desired image. The method works even better for this case, and one result of the algorithm used is shown in FIG. 7. The overall image fidelity is very similar, but the light intensity in the white image region is about 50 times higher. This indicates that the holographic optical element is capable of concentrating the light in a manner analogous to a zone plate.

Both of these example designs show that the carbon relief mask, which is in essence a near-image-plane phase hologram, has the remarkable property that the twin-image, intermodulation and zero-order terms are all suppressed. A general feature of this type of hologram is localization of the recorded information, corresponding to production of each image each image pixel by a moderately small region of the hologram defined by the hologram-image distance d and the numerical aperture NA, as indicated in the discussion of FIG. 1 above. Here, NA is equal to λ/2s, where s is the minimum feature size. One consequence of this is a great reduction in the required coherence length used in illuminating the hologram to reconstruct the original image (projecting the image onto the wafer in the first embodiment). In the present example, the radius of good mutual coherence would need to be 10 μm transversely, and the monochromaticity λ/Δλ0 would need to be 45 waves for 63 nm (0.063 μm) resolution, or 6 μm and 20 waves for 100 nm (0.1 μm) resolution. These requirements are easy to meet and are consistent with X-ray sources capable of illuminating high wafer throughput systems. Another consequence of the localization of information is that one can readily compute a large wave field by dividing it into smaller, computationally tractable parts and stitching the resulting holograms together afterward. Furthermore, in many electronic devices, large regions have repetitive mask patterns; this repetitive feature could be used to ease computation of the hologram. The algorithm for producing a holographic image source rapidly converges to a solution, with most of the optimization occurring during the first few iterations. It may be possible to improve upon this convergence by using an input-output type, rather than an error-reduction type, of algorithm. Uniqueness considerations are eliminated here. We seek any hologram that will produce the desired wafer plane pattern, rather than a unique solution to the inverse source problem.

Figure 8A:
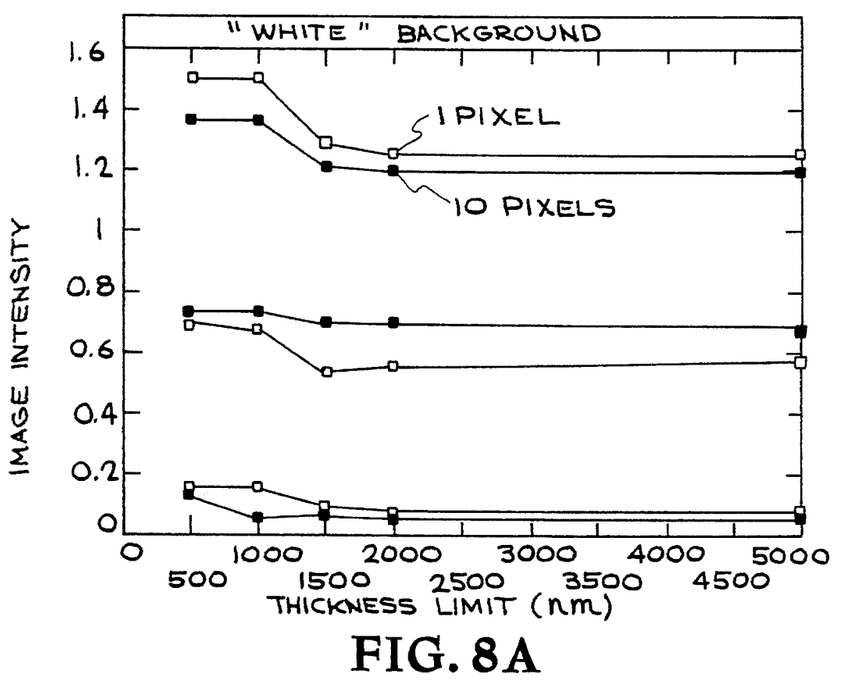
FIGS. 8A and 8B illustrate variation of wafer plane intensity from its desired value with the upper limit placed on carbon hologram thickness, for white and black backgrounds, respectively.
Figure 8B:
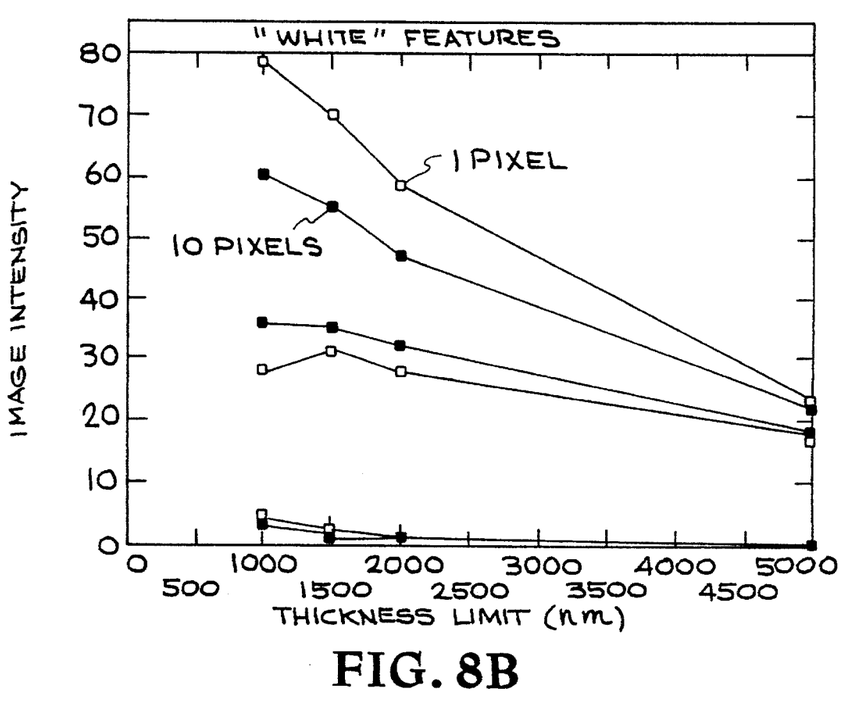

The above simulations assume that we could vary the carbon thickness continuously over the range 0 to 1 µm. FIGS. 8A and 8B illustrate the wafer plane intensity variations calculated with discrete maximum thickness limits of 0.5. 1, 1.5, . . . , 5.0 µm for the white background and black background situations, respectively. For black features on a white background (FIG. 8A), the spread in the range of white intensity values changes little as the thickness limit is varied. In the case of white features on a black background (FIG. 8B), the algorithm seeks to minimize the spread in white intensity values rather than to increase the average white intensity value. If the thickness limit is reduced from 1 µm to 0.5 µm (0.5 µm thickness corresponds to a phase shift of $0.8\pi$), the algorithm is no longer able to produce well-separated white and black intensity levels.

The calculations that implement backpropagation are discussed by L. P. Yaroslavskii and N. S. Merzlyakov, Methods of Digital Holography, translated from Russian by Consultants Bureau, New York and London, 1980, pp. 105–111, and incorporated by reference herein.

Existing fabrication techniques for binary optics for visible light involve overlays of $2^N$ binary etch steps (with each etch pattern written by electron beam lithography) to create $2^N$ allowable thickness values in a refractive media. Because this technology may be directly applicable to our proposed method for X-ray projection lithography, we have also modified our hologram design procedure for the situation where only discrete thickness values are allowed.

Figure 9A:
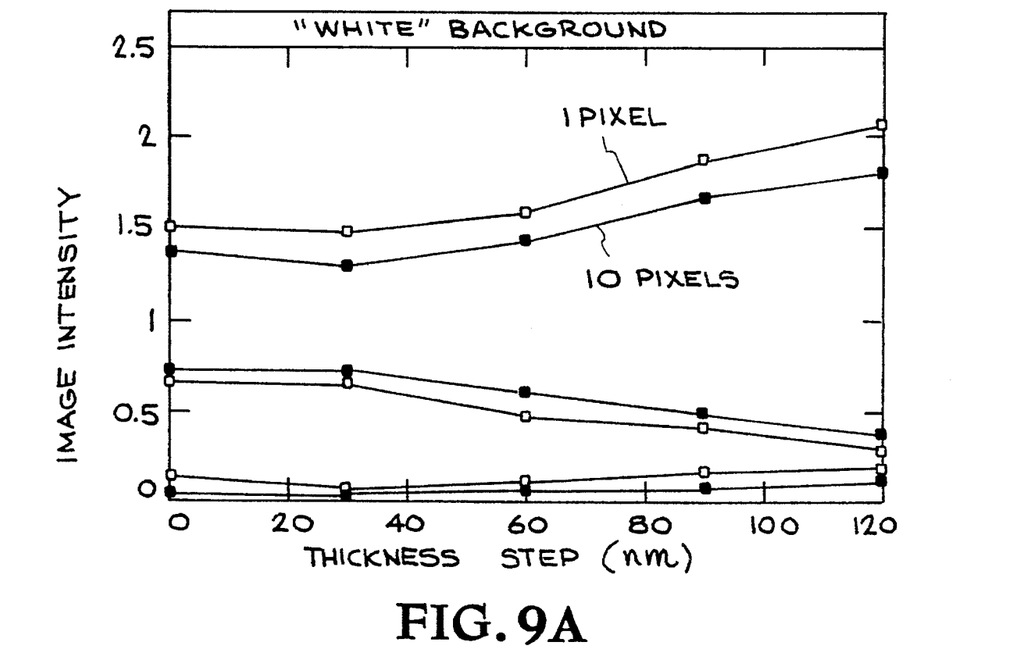
FIGS. 9A and 9B illustrate variation of wafer plane intensity when the hologram thickness is limited to discrete values with steps of 30, 60, 90 and 120 nm, for white and black backgrounds, respectively.
Figure 9B:
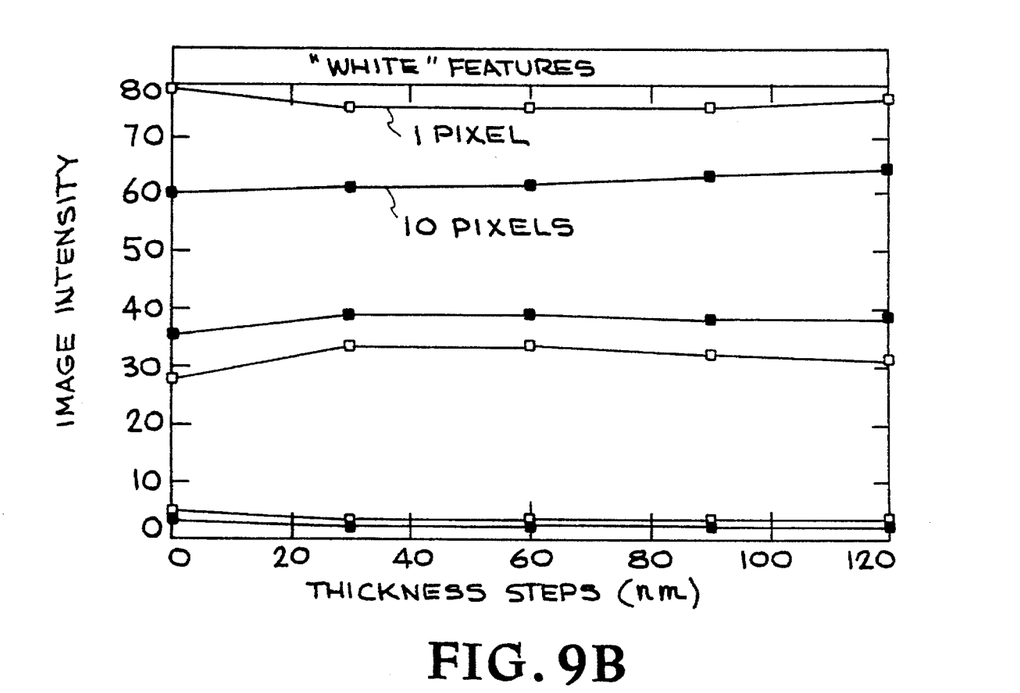

FIGS. 9A and 9B present wafer plane intensity limits calculated with discrete thickness increments of 30, 60, 90, and 120 nm, up to a maximum thickness of 1000 nm, for white and black backgrounds, respectively. This allows 34, 17, 12, and 9 thickness levels, respectively. Where white features are printed on a black background (FIG. 9B), the contrast of the pattern remains quite good, even with only nine allowed thickness levels. We judge the case of printing black features on a whim background to be acceptable only when the thickness step size is 60 nm or less, corresponding to four etch overlays. We assume that one of the 17 gray levels for 60 nm thickness increments can be safely ignored.

Either positive or negative lithographic images, with hologram thicknesses corresponding to about $2\pi$ or more of phase shift, and with only four etch overlays, can be produced by this approach. For example, we have done simulations to generate the same test pattern using $2^4$ thickness levels in 1500 nm of fused quartz at $\lambda=2.5$ nm wavelengths and have obtained results of equally good quality as those shown here for $2^4$ thickness levels in 1000 nm of carbon at $\lambda=5.0$ nm wavelength. Binary optical systems using fused quartz have been fabricated with four etch steps, 500 nm feature width, and 40 nm step thickness, and aspect ratios as high as 20:1 have been achieved in 35 nm linewidth lithography in other contexts. The technological challenges in producing in-line transmission holographic optics for projection X-ray lithography thus appear to be surmountable.

As the linewidth used in X-ray lithography is reduced, the problem of contamination becomes more and more serious. Proximity X-ray lithography with $\lambda=1$ nm X-rays offers some relief from the problem because some types of contaminant particles present on the mask or wafer will be transparent to the X-rays. This fact is considered to be one of the advantages of X-ray lithography. On the other hand, the existence of contaminant particles between the mask and the wafer places limits on how small the mask-wafer gap can be made, and this in turn leads to a corresponding limit on the diffraction-limited resolution. Furthermore, the use of X-rays does not overcome defects in the mask resulting from contamination during its manufacture.

Figure 10A:
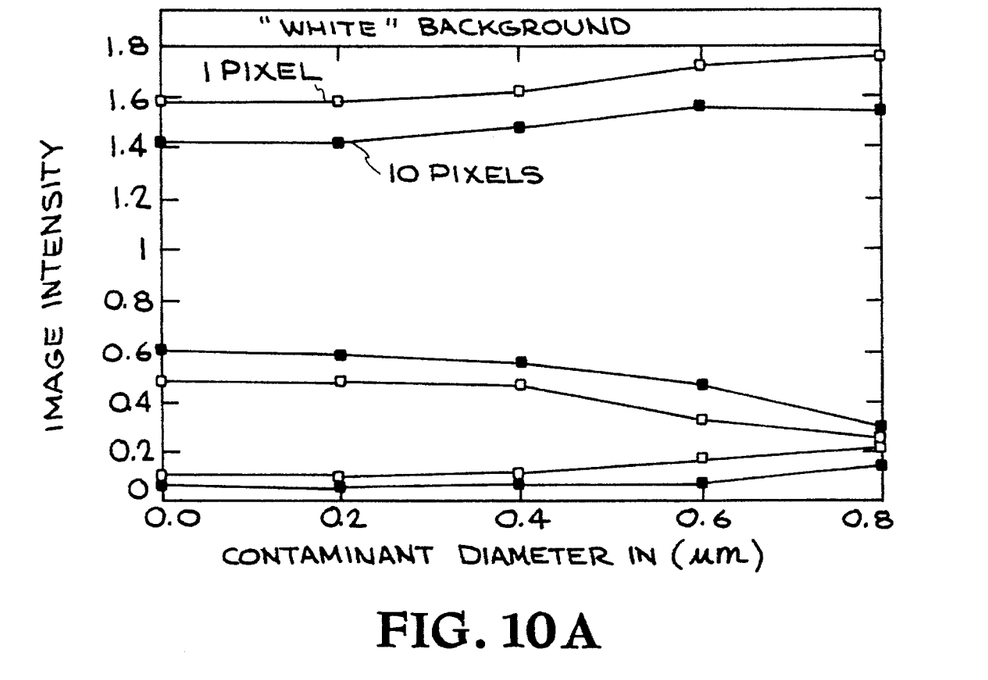
FIGS. 10A and 10B illustrate variation of wafer plane intensity with contaminant diameters of 0.2–1.0 μm, for white and black backgrounds, respectively.
Figure 10B:
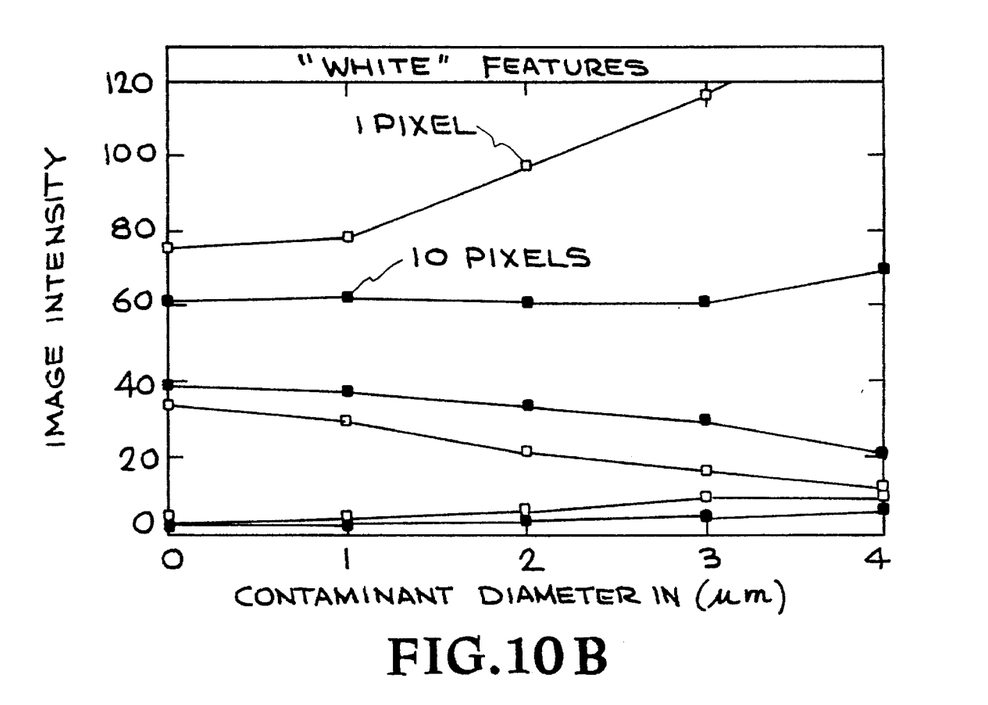

Holography provides a radical new approach to the contamination problem. Because the information relating to each point of the image is distributed over many pixels of the hologram, we expect that it would not matter if a small fraction of that area is blocked by a defect or a contaminant. This will more likely be true if the wafer is in the far field of the defect; i.e., if the defect size is less than about $d'=[\lambda d]^{1/2}$. With a hologram-to-mask separation distance $d=200$ µm and wavelength $\lambda=5$ nm, this threshold defect size becomes 1 µm in the present example. This implies that if a high brightness X-ray source is used for wafer exposure, one may wish to increase the hologram-to-wafer separation distance d above 200 µm to improve immunity to contamination, at the expense of requiring a greater degree of coherence in the illumination of the hologram. As a test of these ideas, we performed simulations where spherical gold particles were assumed to be located on the carbon holograms associated with FIGS. 4 and 7 (one sphere was located at the center, and the other was located near the lower left corner). FIGS. 10A and 10B illustrate an effect of high Z contaminant diameter (0.2–1.0 µm) on wafer plane intensity, for white and black backgrounds, respectively. FIGS. 10A and 10B indicate that, if these high Z contaminants are sufficiently small, of size<0.4 µm for printing black features on a white background, or of size<1 µm for printing white features on a black background, the desired wafer plane image is produced with almost no degradation. This result is also valid for low Z contaminants. These values apply to a choice of d=200 µm for hologram separation distance, but we can obtain immunity to the presence of still larger contaminant particles by using a larger separation distance d. This property, that mask defects or contaminants will often not lead to image defects, is a considerable advantage of the technique, and may have significant impact on the economics of device manufacture.

Figure 11:
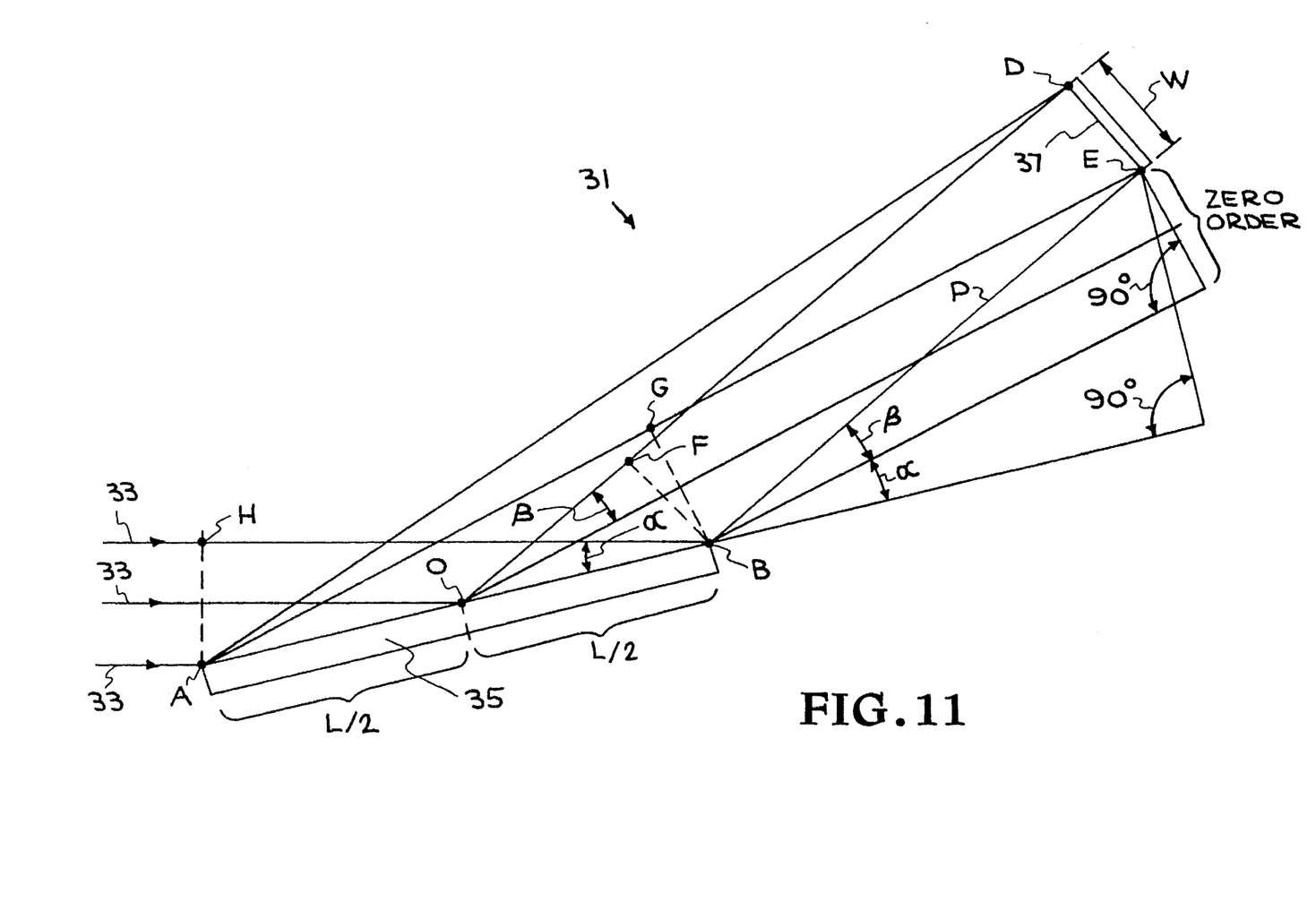
FIG. 11 illustrates a second embodiment of the invention, using reflection from a holographic image to produce a desired image or pattern at a wafer or other substrate.

A second embodiment of the invention uses reflection from a hologram to form image features of a given size on the wafer or substrate. With reference to the reflection configuration 31 shown in FIG. 11, for a feature size s, illumination wavelength $\lambda$, hologram width L and a square wafer image field of area $w^2$, the numerical aperture for this arrangement is $$NA = \sin \beta = K\lambda/s, \qquad (1)$$

where K is a dimensionless empirical number of the order of 1. In FIG. 11, a light beam 33 of wavelength $\lambda$ is incident at grazing incidence upon an optical substrate 35 containing a hologram. The grazing incidence angle is $\alpha$ and the diffraction angle of interest is $\beta$, both being chosen based upon considerations of material reflectance and resolution. A wafer 37 has an area of $w^2$ and is illuminated by the diffracted image produced by the incident light beam 33, and satisfactory imaging at the wafer 37 is obtained if the coherence length of the light $\lambda^2/\Delta\lambda$ is equal to the largest path length difference among rays arriving at any point in the image. From the geometry of FIG. 11, it is easily verified that a transverse dimension w of the wafer is determined by the relation $$w = (L/2)\sin(\alpha+\beta) \quad (2)$$

and that the hologram-to-wafer distance is $p = L \sin\alpha/\sin\beta$. The maximum path difference, which occurs for light rays arriving at the point E on the wafer 37, is found to be HBE–AE=BE–GE=$(L \sin\alpha)^2/2p$ and is set equal to the coherence length $\lambda^2/\Delta\lambda$. This yields the relation $$\lambda/\Delta\lambda = Kw \sin\alpha/[s \sin(\alpha+\beta)]. \quad (3)$$

In order to penetrate at least 0.2 μm into a typical photoresist material, light of wavelength $\lambda < 13.5$ nm must be used. Longer wavelengths have advantages in this situation, because monochromer technology becomes easier to implement and the coherent output of a light source improves as the wavelength increases. For grazing incidence angles of 0.15 radians (8.59°) or less, gold and carbon each reflect with greater than 60 percent efficiency for all wavelengths $\lambda > 9.5$ nm. Other attractive choices for the reflective coating include, without limitation, chromium, nickel, rhodium, rhenium, iridium and platinum. Choosing gold with K=1, minimum feature size s=0.1 μm, wafer size w=1 cm and $\lambda > 9.5$ nm, the configurations illustrated in Table 1 should produce acceptable holographic image patterns with minimum feature size s=0.1 μm or larger on the wafer 37.

TABLE 1

Acceptable Configurations For Hologram Reflection Imaging
(s = 0.1 μm)

| λ (nm) | α | β | L (cm) | p (cm) | λ/Δλ | Beam width (cm) |
|---|---|---|---|---|---|---|
| 13 | 8.59° | 7.47° | 7.2 | 8.3 | 54,000 | 1.1 |
| 10 | 8.59° | 5.74° | 8.1 | 12.1 | 60,000 | 1.2 |
| 5 | 5° | 2.87° | 14.6 | 25.4 | 64,000 | 1.3 |
| 1 | 2° | 0.57° | 44.6 | 156.5 | 78,000 | 1.6 |

Although all configurations indicated in Table 1 are feasible, the most easily achievable choice for the second embodiment is the configuration with $\lambda = 13$ nm. This compact system requires a hologram area of size=8 cm×3 cm, with reasonable values of wavelength and feature size, but with synchrotron radiation monochromaticity ($\lambda/\Delta\lambda$) that has not yet been obtained at these low wavelengths. However, the desired radiation monochromaticity appears to be within reach.

Using the grating equation (including the conical diffraction for the transverse direction), the fringe period or resolution for "writing" a hologram to deliver a smallest feature size s=0.1 μm can be estimated. For $\lambda = 10$ nm, the required resolution is 0.33 μm and 0.10 μm for longitudinally and transversely oriented lines, respectively; and for $\lambda = 13$ nm, the required resolution is 0.31 μm and 0.10 μm for longitudinally and transversely oriented lines, respectively This second embodiment of the invention requires use of a very high resolution monochromator, and this is best operated from a low emittance, high brightness synchrotron source. An ideal synchrotron source would be a 6-cm-period undulator on a high brightness storage ring, of energy about 1.5 GeV, delivering a single mode beam. Another possibility is use of an X-ray laser having the appropriate emission wavelength. Presently available X-ray lasers have the necessary monochromaticity but do not yet have sufficient flux per mode per pulse to adequately expose 1 cm² of photoresist material. In this embodiment, an inverse diffraction problem must also be formulated and solved, in order to determine a hologram required to produce a given image on the wafer.

In either embodiment, the wafer or substrate that receives the X-rays from the hologram may be coated with a photoresist material, such as PMMA. The irradiated photoresist material should be developed by procedures well known in the art to bring out the desired image. Although the invention has been illustrated with minimum linewidths as small as 0.06 μm, minimum linewidths as low as 0.01 μm should be achievable with this approach, if the hologram writing device can provide linewidths sufficiently small. Linewidths above a minimum value, such as 0.25 μm, are also easily achieved with this approach.

We claim:

1. A method of forming a desired X-ray image, having minimum image linewidths no greater than s=0.25 μm, on a selected surface of X-ray-sensitive material, the method comprising the steps of:

providing a source of partially spatially coherent X-rays, having a predetermined wavelength $\lambda$ and having a flux at least equal to a predetermined source flux;

providing a layer of X-ray-sensitive material with a selected surface to receive an X-ray image thereat;

positioning a membrane that is at least partly transparent to X-rays of wavelength $\lambda$ and that holds a holographic pattern thereat, between the X-ray source and the X-ray-sensitive material so that X-rays produced by the X-ray source are transmitted through the substrate toward the selected surface;

determining a hologram, having variable thickness and variable associated transmissivity and optical phase angle, for transmission of X-rays of wavelength $\lambda$ through the hologram so that, when the hologram is irradiated by the X-ray source, the X-ray image produced at the selected surface by X-rays diffracted by the hologram is the desired X-ray image, with X-ray image minimum linewidths no greater than 0.25 μm;

positioning the hologram on the membrane; and irradiating the selected surface with X-rays received by transmission through the hologram to produce the desired X-ray image.

2. The method of claim 1, further comprising the steps of choosing a photoresist material that is sensitive to X-rays of said wavelength $\lambda$ as said X-ray-sensitive material; and developing the photoresist material after said selected surface is irradiated with X-rays from said hologram.

3. The method of claim 2, further comprising the step of choosing said wavelength $\lambda$ to be no greater than 13.5 nm.

4. The method of claim 1, further comprising the step of choosing an X-ray synchrotron radiation source, with associated emission wavelengths $\lambda$ no greater than 13.5 nm, as said X-ray source.

5. The method of claim 1, further comprising the step of choosing laser-produced X-rays, with associated emission wavelength $\lambda$ no greater than 13.5 nm, as said X-ray source.

6. The method of claim 1, further comprising the step of choosing said X-ray image minimum linewidths to be no greater than 0.06 μm.

7. A method of forming a desired X-ray image, having image minimum linewidths no greater than s=0.25 μm, on a selected surface of X-ray-sensitive material, the method comprising the steps of:

providing a source of plane wave, approximately spatially coherent X-rays, having a predetermined wavelength $\lambda$ and having a flux at least equal to a predetermined source brightness;

providing a layer of the X-ray-sensitive material with a selected surface to receive an X-ray image thereat;

positioning a substrate that holds a holographic pattern thereat, approximately between the X-ray source and the X-ray-sensitive material so that X-rays produced by the X-ray source and received by the substrate are reflected and diffracted toward and received by the selected surface;

determining a hologram having variable associated optical phase angle, for reflection of X-rays of wavelength $\lambda$ from an X-ray-receiving surface of the hologram, so that, when the hologram is irradiated by the X-ray source, the X-ray image produced at the selected surface by diffraction of X-rays by the hologram is the desired X-ray image, with X-ray image minimum linewidths no greater than 0.25 µm;

positioning the hologram on the substrate; and irradiating the selected surface with X-rays reflected from the hologram.

8. The method of claim 7, further comprising the steps of:

choosing a photoresist material that is sensitive to X-rays of said wavelength $\lambda$ as said X-ray-sensitive material; and developing the photoresist material after said selected surface is irradiated with X-rays from said hologram.

9. The method of claim 8, further comprising the step of choosing said wavelength $\lambda$ to be no greater than 13.5 nm.

10. The method of claim 7, further comprising the step of choosing laser-produced X-rays, with associated emission wavelength $\lambda$ no greater than 13.5 nm, as said light source.

11. The method of claim 7, further comprising the step of choosing an X-ray synchrotron radiation source, with associated emission wavelengths $\lambda$ no greater than 13.5 nm, as said light source.

12. The method of claim 7, further comprising the step of choosing said X-ray image minimum linewidths to be no greater than 0.06 µm.

13. A method of non-contact printing of a microfabrication pattern having pattern minimum image linewidths less than 0.25 µm, the method comprising the steps of:

providing X-rays from an X-ray source having a predetermined monochromaticity;

directing X-rays produced by the X-ray source toward a hologram that produces the desired pattern; and positioning a substrate having an X-ray-sensitive surface at a position to receive the holographic image produced by the hologram.

14. The method of claim 13, further comprising the step of choosing said hologram as a transmission hologram positioned on a membrane that transmits X-rays, where at least a portion of said X-rays received by said hologram are transmitted through said hologram and through the membrane and forms an image on said X-ray-sensitive surface.

15. The method of claim 13, further comprising the step of choosing said hologram as a grazing incidence reflection hologram that reflects and diffracts at least a portion of said X-rays received by said hologram and forms an image on said X-ray-sensitive surface.

16. Apparatus for non-contact printing of a microelectronic pattern having pattern minimum image linewidths no greater than 0.25 µm, the apparatus comprising:

a source of X-rays having predetermined monochromaticity and brightness;

a wafer having an X-ray-sensitive surface; and a hologram that produces the desired pattern, positioned between the X-ray source and the wafer and spaced apart from the wafer by a selected separation distance.

17. The apparatus of claim 16, wherein said hologram is a transmission hologram positioned on a membrane that transmits X-rays, and at least a portion of the X-rays received by said hologram are transmitted through said hologram and the membrane and forms an image said X-ray-sensitive surface.

18. The apparatus of claim 17, wherein said X-rays have a wavelength $\lambda$ lying in the range $1 \text{ nm} \leq \lambda \leq 13.5 \text{ nm}$.

19. The apparatus of claim 17, wherein said X-ray source has a monochromaticity $\Delta\lambda/\lambda$ lying in the range 0–45.

20. The apparatus of claim 17, wherein said pattern minimum linewidth is no greater than 0.06 µm.

21. The apparatus of claim 17, wherein said hologram is formed from material that is predominantly carbon.

22. The apparatus of claim 17, wherein said hologram is formed from material drawn from the class of optical materials consisting of carbon, silicon, germanium, gallium arsenide, fused quartz, silicon oxide, silicon nitride, nickel, gold, silver, palladium and platinum.

23. The apparatus of claim 16, wherein said hologram is a grazing incidence reflection hologram that reflects and diffracts incident X-rays and forms an image on said X-ray-sensitive surface.

24. The apparatus of claim 23, wherein said X-rays have a wavelength $\lambda$ lying in the range $9.5 \text{ nm} \leq \lambda \leq 13.5 \text{ nm}$.

25. The apparatus of claim 23, wherein said X-ray source has a monochromaticity $\Delta\lambda/\lambda$ lying in the range 6,000–78,000.

26. The apparatus of claim 23, wherein said pattern minimum linewidth is no greater than 0.06 µm.

27. The apparatus of claim 23, wherein said hologram is formed from a material drawn from the class of materials having high reflectance at low wavelengths and consisting of carbon, gold, chromium, nickel, rhodium, rhenium, iridium and platinum.

* * * * *